United States Patent [19]

Sekiguchi et al.

[11] Patent Number: 5,116,642
[45] Date of Patent: May 26, 1992

[54] THICK FILM FORMING PROCESS

[75] Inventors: Takeshi Sekiguchi; Nobuo Shiga, both of Yokohama, Japan

[73] Assignee: Sumitomo Electric Industries, Ltd., Osaka, Japan

[21] Appl. No.: 683,033

[22] Filed: Dec. 20, 1990

Related U.S. Application Data

[63] Continuation of Ser. No. 367,019, Jun. 16, 1989, abandoned.

[30] Foreign Application Priority Data

Jun. 22, 1988 [JP] Japan .................................. 63-153739

[51] Int. Cl.⁵ ............................................. C23C 26/00
[52] U.S. Cl. ..................................... 427/96; 427/372.2
[58] Field of Search ............................... 427/96, 372.2

[56] References Cited

U.S. PATENT DOCUMENTS

| | | | |
|---|---|---|---|
| 3,798,059 | 3/1974 | Astle | 427/96 |
| 4,324,815 | 4/1982 | Mitami | 427/96 |
| 4,457,861 | 7/1984 | Des Marais | 427/96 |
| 4,486,738 | 12/1984 | Sadlo | 427/96 |
| 4,529,477 | 7/1985 | Lundberg | 427/96 |
| 4,622,239 | 11/1986 | Schoenthaler | 427/96 |
| 4,656,048 | 4/1987 | Kudoh | 427/96 |
| 4,664,945 | 5/1987 | Maeda | 427/96 |
| 4,720,402 | 1/1988 | Wojuk | 427/96 |
| 4,743,465 | 5/1988 | Saeki | 427/96 |

FOREIGN PATENT DOCUMENTS

| | | | |
|---|---|---|---|
| 285850 | 10/1988 | European Pat. Off. | 427/96 |
| 347824 | 12/1989 | European Pat. Off. | 427/96 |
| 319990 | 12/1989 | Japan | 427/96 |
| 8700721 | 1/1987 | PCT Int'l Appl. | 427/96 |

OTHER PUBLICATIONS

Walter M. Mathias, "Additive Direct Writing: An Emerging Technology", Hybrid Circuit Technology, Apr., 1987, pp. 19-21.

J. R. Wylie, "Selective Flow Coating of Thin Film Integrated Circuits", Western Electric Technical Digest No. 36, Oct. 1974, pp. 33-34.

Patent Abstracts of Japan, vol. 9, No. 85, (E-308) [1808], Apr. 13, 1985.

Primary Examiner—Shrive Beck
Assistant Examiner—Vi D. Dang
Attorney, Agent, or Firm—Beveridge, DeGrandi & Weilacher

[57] ABSTRACT

A thick film forming process according to the present invention comprises using the screen printing to form thick films in the vicinity of the edges or parts of large areas of a substrate, and next using the direct writing to form thick films of patterns on the other parts of the substrate. The process of this invention enables a circuit pattern in thick films to be changed easily in set conditions.

21 Claims, 5 Drawing Sheets

FIG. IA
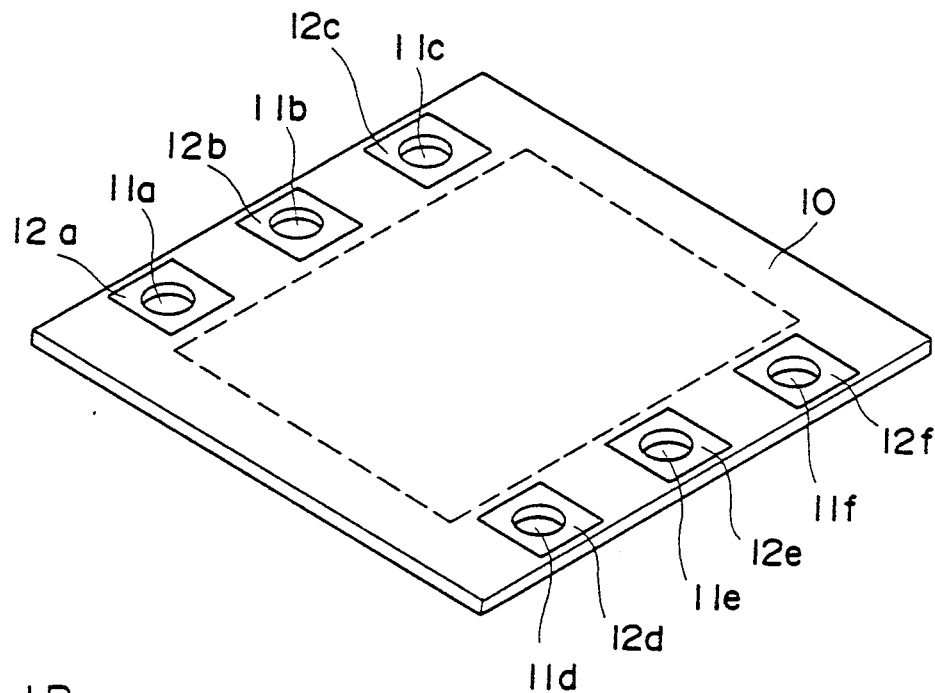
FIG. IB
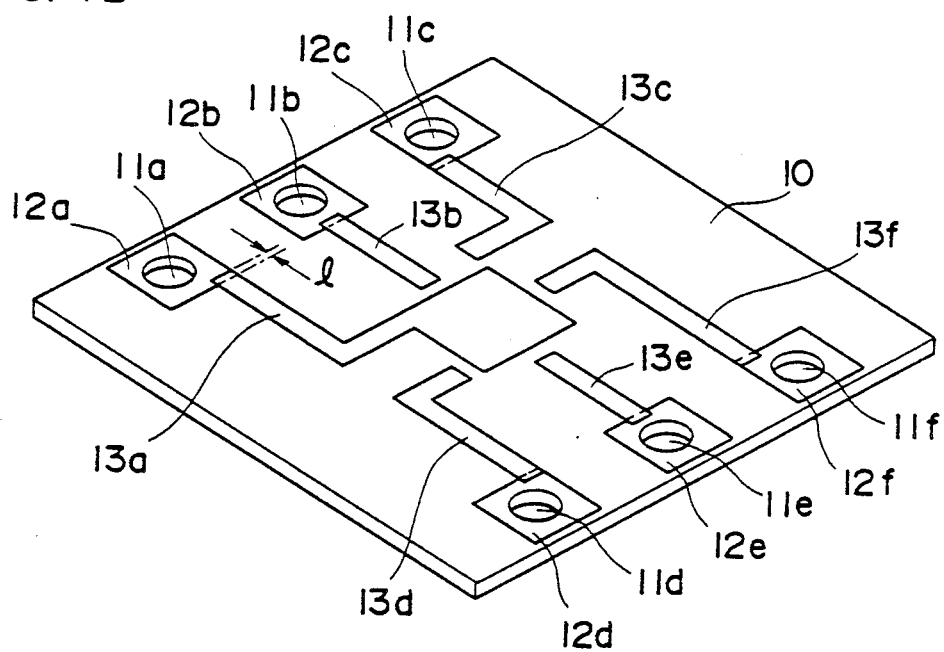

F I G. 3C
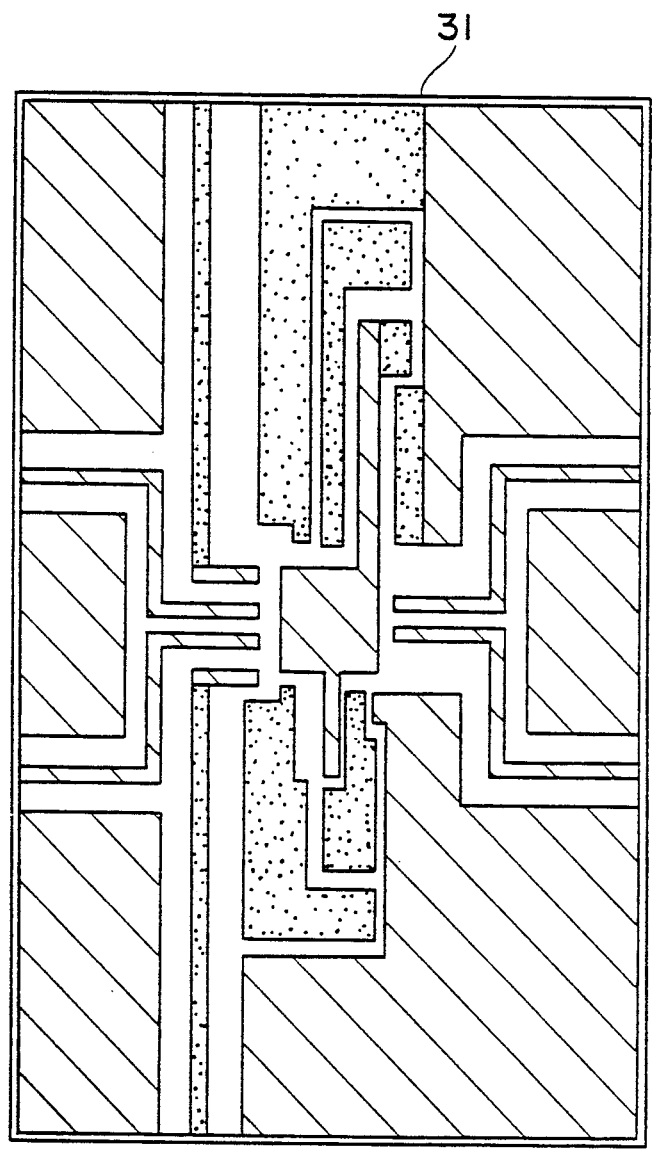

THICK FILM FORMING PROCESS

This application is a continuation of U.S. application Ser. No. 07/367,019, filed Jun. 16, 1989 now abandoned.

BACKGROUND OF THE INVENTION

1. Field of the Invention

The present invention relates to a thick film forming process, specifically a thick film forming process which is effective in studying and developing circuits utilizing thick film patterns.

2. Related Background Art

The thick film forming process is classified largely into two types. One of them is screen printing, which is commonly used. The other is direct writing, which is suitable for small quantity production.

The first step in the screen printing is to design a circuit pattern and make a mask (screen) containing the open pattern based on the designed circuit pattern. Then, using the thus prepared masks, paste for a conductor, dielectric or resistor, etc. is printed on a substrate. It usually takes about one week to make the mask in the screen printing, and the screen printing is unsuitable for cases in which pattern changes are frequent.

On the other hand, in the direct writing, a nozzle with a tiny opening is moved over a substrate in accordance with a pre-designed circuit pattern, extruding the paste so as to write a required pattern directly on the substrate. The direct writing requires no step of making a mask having patterns. Accordingly the direct writing takes less time from designing a circuit pattern to form a thick film pattern actually on a substrate than the screen printing.

But the direct writing is not efficient to form patterns having thick lines and large regions, because the patterns have to be formed by laying thin lines.

Furthermore, in the direct writing, in order to keep a film thickness of a pattern constant, on the tip end of the nozzle there is provided a spacer for keeping a gap between a substrate and the tip end of the nozzle constant. But when the spacer comes off a surface of a substrate at an edge thereof, a required gap from the substrate surface to the nozzle can not be kept any more and the movement of the nozzle is limited. Consequently sometimes a required pattern cannot be written.

SUMMARY OF THE INVENTION

A first object of the present invention is to provide a thick film forming process which is effective in studying and developing circuits using thick film patterns.

A second object of the present invention is to provide a thick film forming process in which a thick film on a substrate can be formed even in the vicinity of the edges thereof and besides required thick film patterns can be formed in a short period of time.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1A and 1B are perspective views explaining steps of the thick film forming process according to a first embodiment of this invention;

FIGS. 3A, 3B, and 3C are plan views showing the thick film forming process according to a second embodiment of this invention.

DESCRIPTION OF THE PREFERRED EMBODIMENT

In a first embodiment of the present invention as shown in FIG. 1A, a substrate 10 is made of ceramic, such as alumina. The substrate 10 has openings $11a$–$11f$ for receiving external terminals in the boundary portion thereof. At the periphery of each opening $11a$–$11f$ a thick film $12a$–$12f$ as a pad is patterned in a rectangle by the screen printing.

Here the step of forming the thick films $12a$–$12f$ will be briefed below. First of all, a pattern is designed, and in accordance with the design, a mask having the open pattern is made. As described above, it takes about one week to a make mask. Then the mask is aligned with the substrate 10. Then gold paste is applied to the mask to form the pattern of the gold paste on the substrate 10. Subsequently the pattern of the gold paste is dried and sintered, and the gold thick films $12a$–$12f$ are formed.

Figure 2:
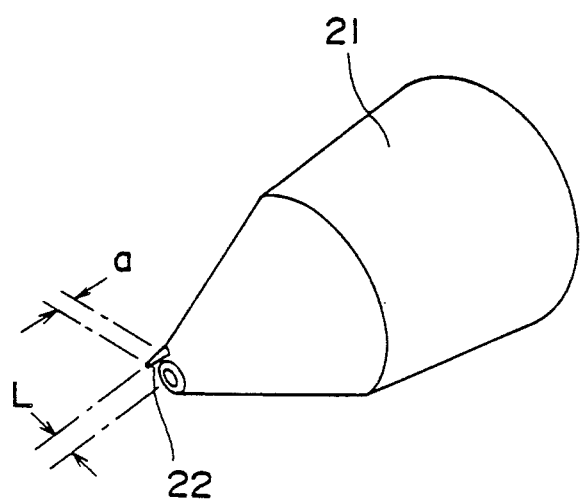
FIG. 2 is a perspective view of the tip end of a nozzle used in the direct writing.

Subsequently, a required pattern is written by the direct writing in a region enclosed by the broken line in FIG. 1A, i.e., a region where frequent pattern changes are required. FIG. 1B shows an example of the direct pattern writing. As shown in FIG. 1B, thick films $13a$–$13f$ are contacted with the thick films $12a$–$12f$ which have been provided by the screen printing. As a whole, thick films of a required pattern are formed. In the direct writing, which requires no masks, a required pattern is written directly on the substate 10 with gold paste discharged from a nozzle of FIG. 2. A diamond needle 22 as a spacer is attached to the tip end of the nozzle 21. In this example, the distance (a) from the tip end of the nozzle 21 to that of the diamond needle is 50 $\mu$m. Paste is discharged from the nozzle 21 in continuous, while the tip end of the diamond needle 22 is being contacted with a surface of the substrate 10 and the nozzle 21 is being moved over the substrate 10 in accordance with a designed pattern. Accordingly the designed pattern of the gold paste is written on the substrate 10.

The device for the direct writing is commercially available and comprises a writing head with a nozzle, an X-Y table which is movable in the X-Y directions (in plan) with a substrate mounted on, and a controller which controls the movements of the writing head and the table.

The substrate of FIG. 1A, which has been already provided with the thick films $12a$–$12f$ by the screen printing, is mounted on the X-Y table, and all is set for a direct writing operation. Subsequently designed pattern information is supplied by an external computer to the controller and the controller is actuated. The controller controls the discharge amount of gold paste from the nozzle and the movement of the X-Y table based on the pattern information, and as the result, the pattern writing with gold paste is automatically completed.

Then follow the drying and sintering steps as in the screen printing, and the thick films of the required pattern as shown in FIG. 1B are formed.

Here it is assumed that the thick films 12a-12f on the peripheries of the openings 11a-11f are formed by the direct writing. In the writing operation, the diamond needle 22 as a spacer often falls into openings 11a-11f eventually failing to retain any more a gap between the nozzle and the substrate 10. When the nozzle in this state is further moved, the diamond needle 22 catches on the edge of the opening, and breaks the edge or itself.

For the prevention of this problem, in this embodiment, the screen printing is used to form the thick films on the peripheries of the openings.

The problem with the direct writing that the spacer 22 falls off a surface of the substrate takes place also in forming thick films in the vicinities of the outer edges of the substrate 10. But it is easily seen from this embodiment that the problem with this case can be overcome by using the screen printing to form the thick films in the vicinities of the outer edges of the substrate.

The terms of peripheries of the openings and vicinities of the outer edges of the substrate can be more clarified by the following description. That is, peripheries of the openings means a surface region within a distance of $L+l$ from the edges of the openings 11a-11f, and vicinities of the outer edges of the substrate means a surface region within a distance of $L+l$ from the outer edges of the substrate 10 when a distance from the spacer 22 to the center of the opening of the tip end of the nozzle 21 is represented by L, and a length of a minimum required overlap between the thick films formed by the screen printing and those formed by the direct writing for electrical connection therebetween is represented by l. L varies depending on nozzles, but L is usually 100-200 $\mu$m. l is usually 100-200 $\mu$m.

Figure 3A:
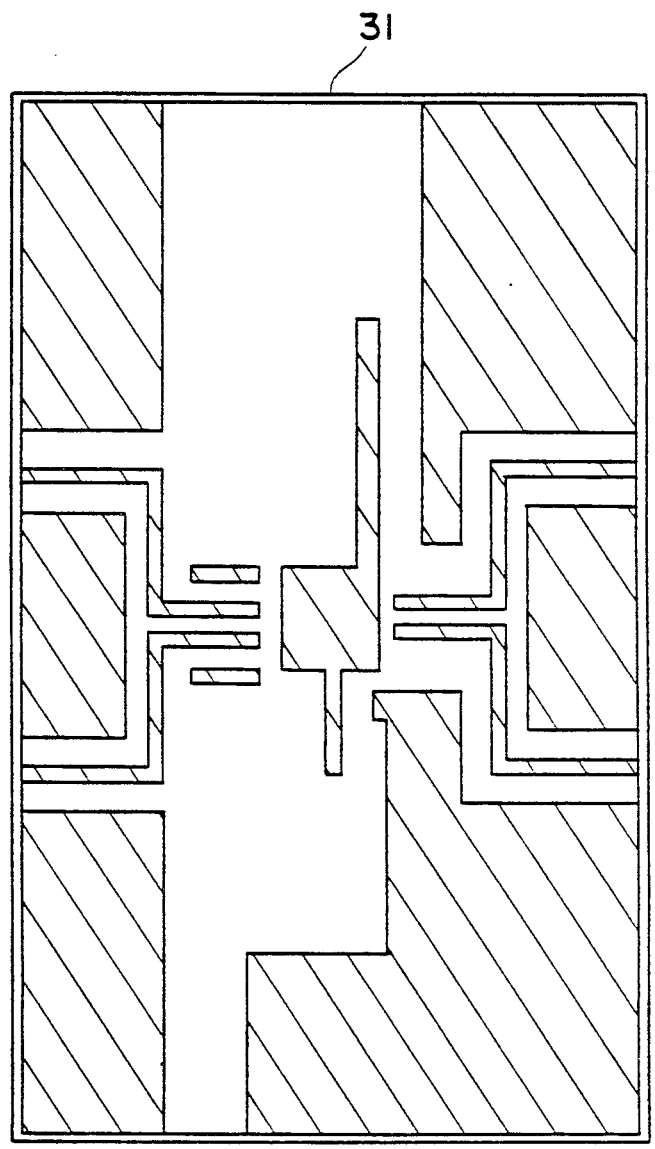

A second embodiment of the invention will be explained with reference to FIGS. 3A-3C. This embodiment is based on that thick films of one of two different patterns are formed on each of a plurality of substrates and that the two different patterns have a common part. The thick film at the common part is firstly formed by the screen printing. That is, the thick films are formed by making a mask having a designed open pattern, printing the patterns of gold paste and sintering the same. The hatched part in FIG. 3A indicates a pattern of the common part formed on a substrate 31. In the screen printing, a time required for a printing operation following a mask making is short. In this respect the screen printing is suitable for mass production. On this stage, a number of substrates each having a thick film of the pattern for the common part in FIG. 3A are fabricated.

Figure 3B:
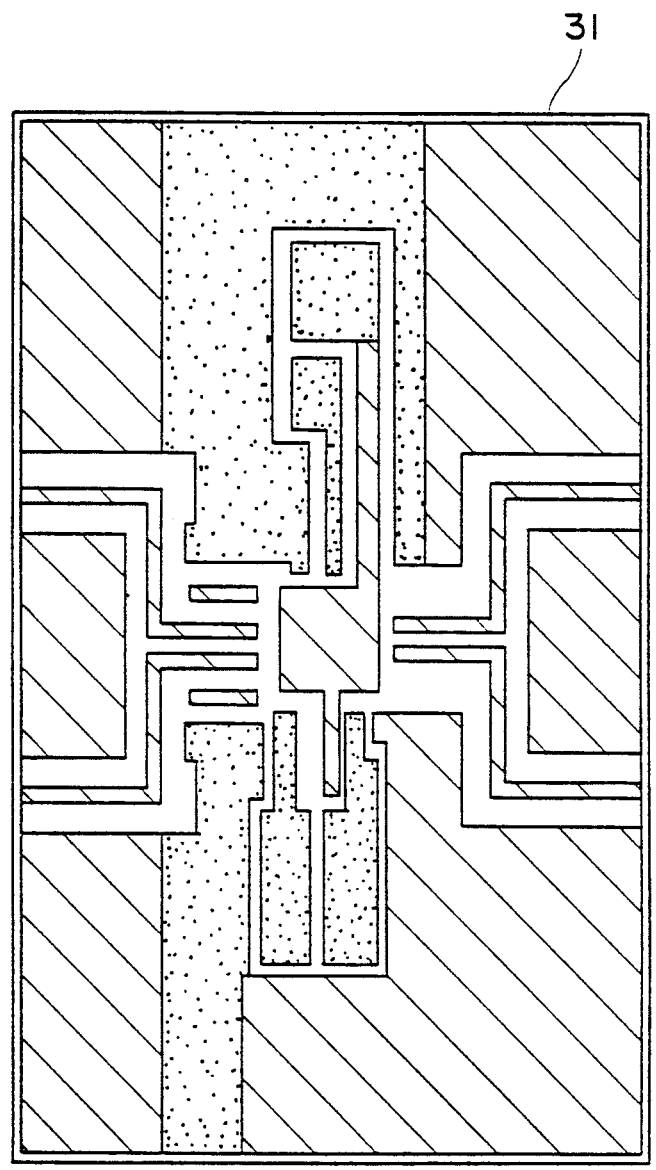

Next, the direct writing is used to form on each substrate a pattern of a gold paste indicated by the dotted part in FIGS. 3B or 3C. As in the screen printing, sintering is performed after the pattern of a gold paste is formed. In FIGS. 3B and 3C, the hatched regions are the common pattern in FIG. 3C. The direct writing takes a shorter period of time as a writing area is smaller. Accordingly, as in this embodiment, fabricating beforehand a number of substrates each having the thick film of the common pattern formed shortens the writing time more than writing the whole pattern by the direct writing.

In the above described embodiments, the gold paste pattern formed by the screen printing is dried and sintered before the direct writing so as to make the thick films perfect, but the drying and the sintering on this stage may be omitted to thereby simplify the processing steps.

In the first embodiment, the screen printing, and the direct writing are applied separately to the vicinities of the edges and to the regions other than the same. In the second embodiment, the screen printing and the direct writing are applied separately to the common part and to the region other than the same.

In other embodiments, it is preferable to use the screen printing and the direct writing separately to a thick line pattern and to a thin line pattern. The direct writing can write thin lines of an about 100 $\mu$m width, but the screen printing cannot write lines of a less than 300 $\mu$m width clearly. Accordingly it makes it possible to form efficiently thick films of required whole patterns by both using the screen printing to form thick films of thick line patterns and using the direct writing to form thick films of thin line patterns.

In the above described embodiments, a substrate on which the thick film patterns are formed is alumina but may be other materials. As the thick film paste, gold paste, which is a conductor, is used, but other conductors, dielectrics, resistor, etc. may be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A process of forming a thick film on a substrate, comprising:
    a first step of successively forming a thick film having a predetermined common pattern on a plurality of said substrates by screen printing;
    a second step of drying and sintering said plurality of substrates on which said predetermined pattern is formed;
    a third step of setting said substrates on a movable table one by one, wherein the movement of the table is controlled on the basis of the thick film pattern formed by said first step; and
    a fourth step of successively forming thick films having different patterns on the individual substrates by using direct writing, wherein the regions of the substrates with thick films formed by direct writing are subject to frequent pattern changes.

2. A thick film forming process according to claim 1, wherein a thick film to be formed in a vicinity of the edge of the substrate is formed in the first step, and a thick film to be formed in a region spaced from the edge is formed in the fourth step.

3. A thick film forming process according to claim 2, wherein a thick film of a thick line pattern is formed in the first step, and a thick film of a thin line pattern is formed in the fourth step.

4. A thick film forming process according to claim 3, wherein a nozzle for discharging a paste for the direct writing has a spacer at the tip end thereof for keeping a gap between the substrate and the same, and when a distance between the spacer and the center of the opening in the tip end of the nozzle is represented by L, and a length of a minimum essential overlap between the thick film formed by the first step and that formed by the fourth step for electric connection therebetween is represented by l, a thick film in the vicinity of the edge within a distance of L+l from the edge is formed in the first step.

5. A thick film forming process according to claim 4, wherein a sintering is omitted in the first step.

6. A thick film forming process according to claim 4, wherein both drying and sintering are omitted in the first step.

7. A thick film forming process according to claim 3, wherein a sintering is omitted in the first step.

8. A thick film forming process according to claim 3, wherein both drying and sintering are omitted in the first step.

9. A thick film forming process according to claim 2, wherein a sintering is omitted in the first step.

10. A thick film forming process according to claim 2, wherein both drying and sintering are omitted in the first step.

11. A thick film forming process according to claim 2, wherein a nozzle for discharging a paste for the direct writing has a spacer at the tip end thereof for keeping a gap between the substrate and the same, and when a distance between the spacer and the center of the opening in the tip end of the nozzle is represented by L, and a length of a minimum essential overlap between the thick film formed by the first step and that formed by the fourth step for electric connection therebetween is represented by l, a thick film in the vicinity of the edge within a distance of L+l from the edge is formed in the first step.

12. A thick film forming process according to claim 11, wherein a sintering is omitted in the first step.

13. A thick film forming process according to claim 11, wherein both drying and sintering are omitted in the first step.

14. A thick film forming process according to claim 1, wherein a thick film of a thick line pattern is formed in the first step, and a thick film of a thin line pattern is formed in the fourth step.

15. A thick film forming process according to claim 14, wherein a nozzle for discharging a paste for the direct writing has a spacer at the tip end thereof for keeping a gap between the substrate and the same, and when a distance between the spacer and the center of the opening in the tip end of the nozzle is represented by L, and a length of a minimum essential overlap between the thick film formed by the first step and that formed by the fourth step for electric connection therebetween is represented by l, a thick film in the vicinity of the edge within a distance of L+l from the edge is formed in the first step.

16. A thick film forming process according to claim 15, wherein a sintering is omitted in the first step.

17. A thick film forming process according to claim 15, wherein both drying and sintering are omitted in the first step.

18. A thick film forming process according to claim 14, wherein a sintering is omitted in the first step.

19. A thick film forming process according to claim 14, wherein both drying and sintering are omitted in the first step.

20. A thick film forming process according to claim 1, wherein a sintering is omitted in the first step.

21. A thick film forming process according to claim 1, wherein both drying and sintering are omitted in the first step.

* * * * *